United States Patent [19]
Gonzalez et al.

[11] Patent Number: 5,841,150
[45] Date of Patent: Nov. 24, 1998

[54] STACK/TRENCH DIODE FOR USE WITH A MUTI-STATE MATERIAL IN A NON-VOLATILE MEMORY CELL

[75] Inventors: Fernando Gonzalez; Ray Turi, both of Boise, Id.

[73] Assignee: Micron Technology, Inc., Boise, Id.

[21] Appl. No.: 799,515

[22] Filed: Feb. 12, 1997

Related U.S. Application Data

[63] Continuation of Ser. No. 483,760, Jun. 7, 1995, abandoned.

[51] Int. Cl.$^6$ ................................................. H01L 47/00
[52] U.S. Cl. .................................. 257/3; 257/4; 257/5
[58] Field of Search .............................. 257/395, 396, 257/397, 2, 3, 4, 5; 365/163

[56] References Cited

U.S. PATENT DOCUMENTS

| | | | |
|---|---|---|---|
| 3,423,646 | 1/1969 | Cubert et al. | 317/234 |
| 3,796,926 | 3/1974 | Cole et al. | 317/234 R |
| 3,875,566 | 4/1975 | Helbers | 340/173 R |
| 4,099,260 | 7/1978 | Lynes et al. | 365/105 |
| 4,115,872 | 9/1978 | Bluhm | 365/163 |
| 4,174,521 | 11/1979 | Neale | 357/45 |
| 4,194,283 | 3/1980 | Hoffmann | 29/571 |
| 4,203,123 | 5/1980 | Shanks | 357/2 |
| 4,227,297 | 10/1980 | Angerstein | 29/571 |
| 4,272,562 | 6/1981 | Wood | 427/87 |
| 4,458,260 | 7/1984 | McIntyre et al. | 357/30 |
| 4,502,208 | 3/1985 | McPherson | 29/584 |
| 4,569,698 | 2/1986 | Feist | 148/1.5 |
| 4,757,359 | 7/1988 | Chiao et al. | 357/23.5 |
| 4,804,490 | 2/1989 | Pryor et al. | 252/62.3 BT |
| 4,809,044 | 2/1989 | Pryor et al. | 357/2 |
| 4,823,181 | 4/1989 | Mohsen et al. | 357/51 |
| 4,876,220 | 10/1989 | Mohsen et al. | 437/170 |
| 4,876,668 | 10/1989 | Thakoor et al. | 365/163 |
| 4,881,114 | 11/1989 | Mohsen et al. | 357/54 |
| 4,892,840 | 1/1990 | Esquivel et al. | 437/52 |
| 5,144,404 | 9/1992 | Iranmanesh et al. | 357/51 |
| 5,166,096 | 11/1992 | Cote et al. | 437/195 |
| 5,166,758 | 11/1992 | Ovshinsky et al. | 257/3 |
| 5,177,567 | 1/1993 | Klersy et al. | 257/4 |
| 5,296,716 | 3/1994 | Ovshinsky et al. | 257/3 |
| 5,335,219 | 8/1994 | Ovshinsky et al. | 369/288 |
| 5,341,328 | 8/1994 | Ovshinsky et al. | 365/163 |
| 5,359,205 | 10/1994 | Ovshinsky | 257/3 |
| 5,510,629 | 4/1996 | Karpovich et al. | 257/50 |

FOREIGN PATENT DOCUMENTS

| | | | |
|---|---|---|---|
| 0 117 045 | 8/1984 | European Pat. Off. | H01L 45/00 |
| 60-109266 | 6/1985 | Japan | H01L 27/10 |
| 1 319 388 | 6/1973 | United Kingdom | H01L 9/00 |
| 1 347 688 | 2/1974 | United Kingdom | H01L 19/00 |
| WO 93/04506 | 3/1993 | WIPO | H01L 45/00 |

OTHER PUBLICATIONS

Kim and Kim, "Effects of High–Current Pulses on Polycrystalline Silicon Diode with n–type Region Heavily Doped with Both Boron and Phosphorus," *J. Appl. Phys.*, 53(7):5359–5360, 1982.

Neale and Aseltine, "The Application of Amorphous Materials to Computer Memories," *IEEE*, 20(2):195–205, 1973.

(List continued on next page.)

*Primary Examiner*—Minh-Loan Tran
*Attorney, Agent, or Firm*—Fletcher, Yoder & Edwards

[57] ABSTRACT

The invention provides a vertically oriented diode for use in delivering large amounts of current to a variable resistance element in a multi-state memory cell. The vertical diode is disposed in a diode container extending downwardly from the top of a tall oxide stack into a deep trench in single crystal silicon. The diode is formed of a combination of single crystal and/or polycrystalline silicon layers disposed vertically inside the diode container. The memory element is formed above the diode to complete a memory cell. The vertical construction of the diode provides a large diode surface area capable of generating a very large current flow through the memory element, as is required for programming. In this way, a highly effective diode can be created for delivering a large current without requiring the substrate surface space normally associated with such large diodes.

16 Claims, 7 Drawing Sheets

OTHER PUBLICATIONS

Pien and Plummer, "Performance of the 3–D Sidewall Flash EPROM Cell," *IEDM 93,* 11–14, 1993.

Post and Ashburn, "Investigation of Boron Diffusion in Polysilicon and Application to the Design of p–n–p Polysilicon Emitter Bipolar Transistors with Shallow Emitter Junctions," *IEEE*, 38(11):2442–2451, 1991.

Post et al., "Polysilicon Emitters for Bipolar Transistors: A Review and Re–Evaluation of Theory and Experiment," *IEEE*, 39(7):1717–1731, 1992.

Post and Ashburn, "The Use of an Interface Anneal to Control the Base Current and Emitter Resistance of p–n–p Polysilicon Emitter Bipolar Transistors," *IEEE*, 13(8):408–410, 1992.

Rose et al., "Amorphous Silicon Analogue Memory Devices," *J. Non–Crystalline Solids*, 115:168–170, 1989.

Schaber et al., "Laser Annealing Study of the Grain Size Effect in Polycrystalline Silicon Schottky Diodes," *J. Appl. Phys.*, 53(12):8827–8834, 1982.

Yamamoto et al., "The I–V Characteristics of Polycrystalline Silicon Diodes and the Energy Distribution of Traps in Grain Boundaries," *Electronics and Communications in Japan*, Part 2, 75(7):51–58, 1992.

Yeh et al., "Investigation of Thermal Coefficient for Polycrystalline Silicon Thermal Sensor Diode," *Jpn. J. Appl. Phys.*, 31(Part 1, No. 2A):151–155, 1992.

STACK/TRENCH DIODE FOR USE WITH A MUTI-STATE MATERIAL IN A NON-VOLATILE MEMORY CELL

CROSS-REFERENCE TO RELATED APPLICATIONS

This application is a continuation of application Ser. No. 08/483,760, filed on Jun. 7, 1995, now abandoned.

BACKGROUND OF THE INVENTION

The present invention relates generally to the use of multi-state materials, such as chalcogenide, in semiconductor devices and, more particularly relates to the formation of a stack/trench diode that may be used in conjunction with a multi-state material chalcogenide memory element to form an electrical memory cell.

The use of multi-state, variable resistance materials, such as chalcogenide and amorphous silicon, in electronic memories is known in the art. The use of chalcogenides, for example, is disclosed in U.S. Pat. No. 5,296,716, No. 5,335,219, No. 5,341,328, and No. 5,359,205, all to Ovshinsky et al., which are incorporated herein by reference. These patents are believed to evidence the state of the prior art, and to represent the current theory of operation and function of chalcogenide materials and of cells made using chalcogenide.

Briefly, multi-state materials are materials that can be caused to change physical states in response to an input stimulus. By way of example, chalcogenides are materials that may be electrically stimulated to change states and resistivities, from an amorphous state to a crystalline state, for example, or to exhibit different resistivities while in a crystalline state. A chalcogenide material may be predictably placed in a particular resistivity state by running a current of a certain amperage through it. The resistivity state so fixed will remain unchanged unless and until a current having a different amperage within the programming range is run through the chalcogenide material. Because of these unique characteristics, chalcogenide materials may be used in memory cells for storing data in binary or higher-based digital systems.

A chalcogenide-based memory cell will typically include a chalcogenide memory element for storing data and an access element, coupled to the memory element, for use in programming and sensing the stored data. The access element may be, in one embodiment, a diode. A chalcogenide-based memory cell will typically be accessible to external circuitry by the selective application of voltages to address lines, as are conventionally used in semiconductor memories.

Because of the unique operating characteristics of chalcogenide-based memories, control of current flow is crucial to facilitate programming. Programming of chalcogenide requires large current densities. In this regard, it is desirable that a chalcogenide-based memory cell include a diode large enough to permit a large current flow in the forward direction, while allowing essentially no current flow in the reverse direction. Conventional junction diode structures large enough to supply the necessary current require so much space on the upper surface of the silicon substrate that they would negate the space-saving advantages of using chalcogenide in memories. Accordingly, there is a need for a small, easily manufactured diode that can meet the performance requirements of chalcogenide-based memory cells.

SUMMARY OF THE INVENTION

The present invention provides a vertically oriented diode for use in delivering large amounts of current to the multi-state memory element, such as chalcogenide, in a memory cell. A diode container extends downwardly from the top of a tall oxide stack into a deep trench in a single crystal silicon layer. A combination of single crystal silicon and/or polycrystalline silicon layers are disposed vertically inside this container to form the vertical diode therein. Because the vertical diode of the present invention is disposed in both the tall oxide stack and the deep silicon trench, it is referred to as a "stack/trench" diode. The vertical construction provides a large diode surface area capable of generating a large current flow through the memory element. In this way, a highly effective diode can be created for delivering a large current without requiring the substrate surface space normally associated with such large diodes.

BRIEF DESCRIPTION OF THE DRAWINGS

The features and advantages of the present invention will be best appreciated with reference to the following detailed description and the accompanying drawings, in which.

DETAILED DESCRIPTION OF THE PREFERRED EMBODIMENTS

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined in the claims.

Figure 1:
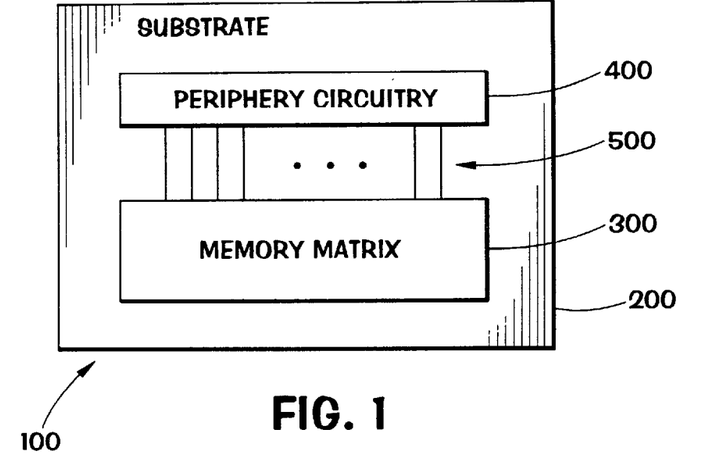
FIG. 1 is a schematic representation of an exemplary semiconductor substrate having a memory matrix formed thereon in electrical communication with periphery circuitry.

FIG. 1 is a schematic depiction of an exemplary electrical memory 100 in accordance with the present invention. Electrical memory 100 comprises semiconductor substrate 200 with memory matrix 300 and periphery circuitry 400 formed thereon. Memory matrix 300 comprises a plurality of memory cells for storing data, as described below. Periphery circuitry 400 comprises circuitry for addressing the memory elements located in memory matrix 300 and storing data therein or retrieving data therefrom. In this regard, periphery circuitry 400 may include circuitry for regulating the voltage level applied across each memory cell in order to determine which of the multiple possible resistivity levels will be programmed into that cell. Memory matrix 300 and addressing matrix 400 are in electrical communication via electrical connection 500.

Figure 2:
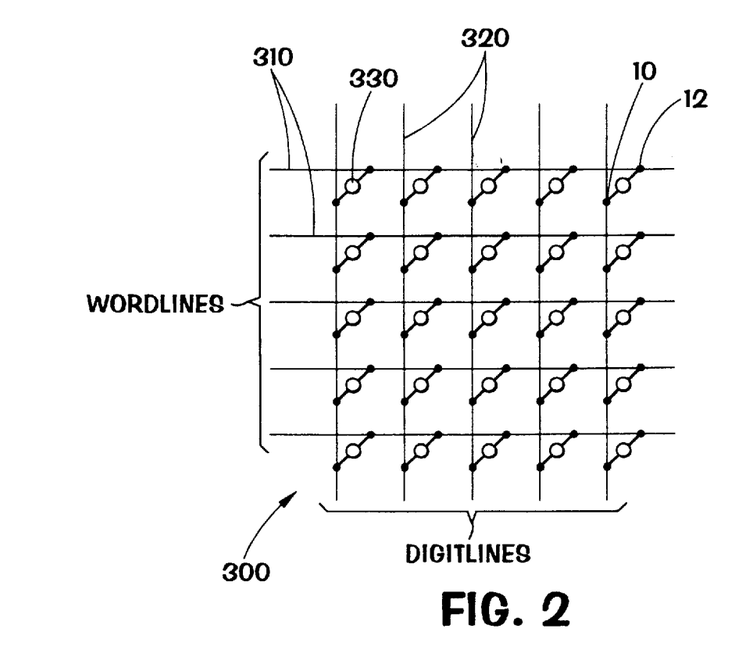
FIG. 2 is a representation of an exemplary memory matrix formed by a plurality of memory cells disposed between wordlines and digitlines according to the present invention.

FIG. 2 schematically depicts an exemplary memory matrix 300. Memory matrix 300 comprises a plurality of horizontally disposed wordlines 310 and vertically disposed digitlines 320 (collectively, "address lines"). A plurality of memory cells 330 are disposed between wordlines 310 and digitlines 320. Each memory cell 330 has a wordline node 12 and a digitline node 10 connected as shown. Wordlines 310 and digitlines 320 are electrically coupled to addressing matrix 400, in a manner well known in the art, so that each memory cell 330 can be uniquely addressed and accessed as needed. Wordlines 310 and digitlines 320 will be used to apply particular voltage levels to each memory cell 330 as needed for operation of memory 100. For example, the voltage differential between wordline 310 and digitline 320 corresponding to a particular cell 330 may be controlled to place the cell 330 in a program mode, a read mode, a deselect mode or a program inhibit mode. Such voltages will preferably be controlled by periphery circuitry 400.

Figure 3:
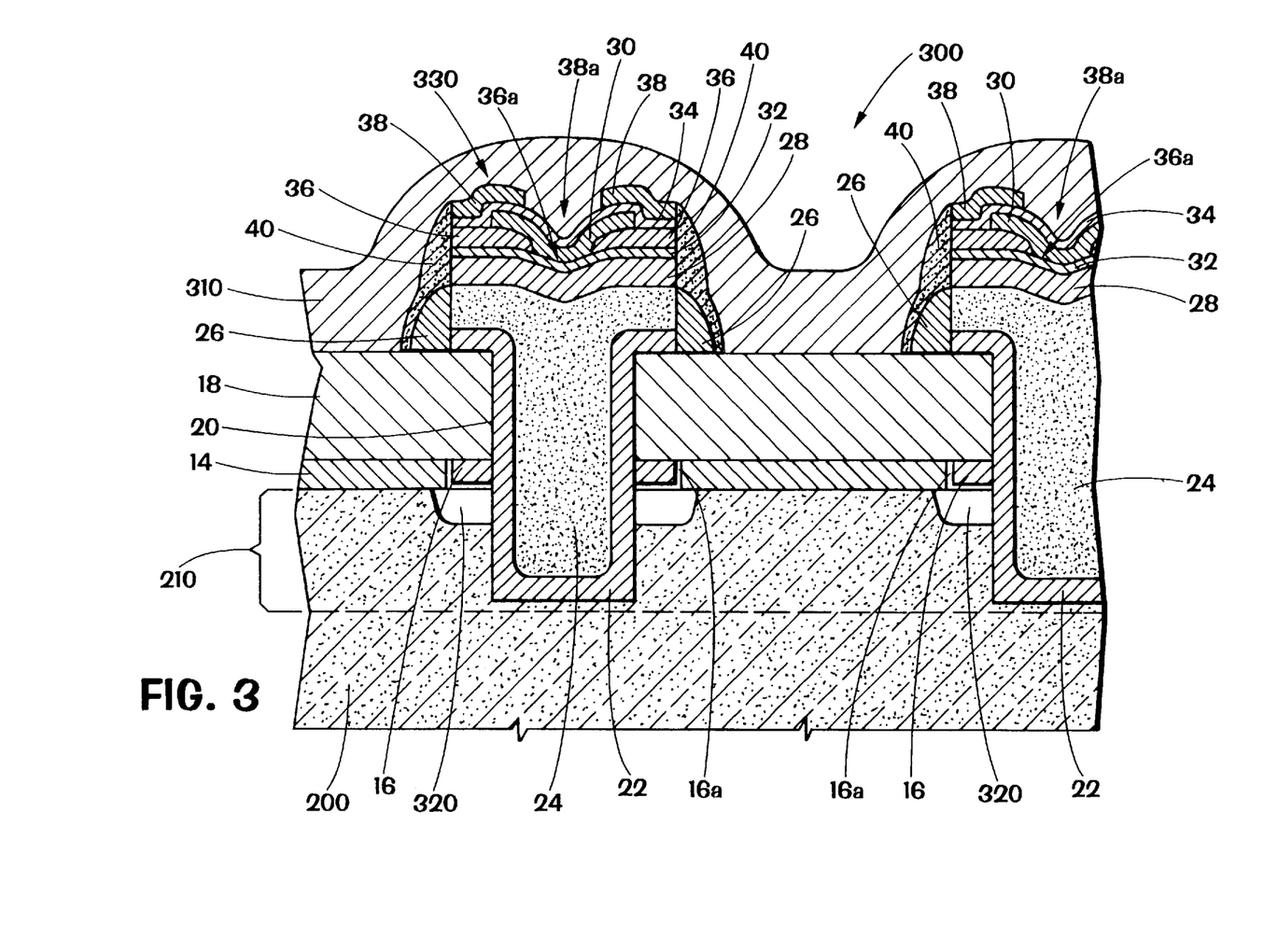
FIG. 3 is a cross-sectional view of an exemplary chalcogenide-based memory cell according to the present invention.

FIG. 3 shows a cross-section of memory matrix 300 including portions of two memory cells 330 according to the present invention. Memory matrix 300 is formed on substrate 200, which is a preferably a p-type substrate. Throughout the specification, there are preferred polarities provided with respect to various components. It will be appreciated that polarities can be reversed throughout the circuit provided without altering the basic inventive concept. In one currently preferred embodiment, an N-well 210 is disposed in substrate 200. N-well 210 is approximately 3.5–4.0 microns deep formed in substrate 200 using conventional techniques known in semiconductor fabrication. It will be appreciated that N-well 210 is merely exemplary of the kind of silicon base that can be used to form the silicon trench. For example, a p-well could be formed in an n-type substrate. Alternatively, the base could be an epitaxial layer. A patterning layer 14 is disposed on top of N-well 210 and defines the pattern for strapping layer 16. Disposed above patterning layer 14 is a tall oxide layer 18. Container 20 is a recess extending downwardly from the top of tall oxide layer 18 into N-well 210. Container 20 is preferably about 2 microns deep.

Memory cell 330 is disposed in and above container 20, electrically situated between digitline 320 and wordline 310. All memory cells 330 in the plane of the cross-section are tied to a single wordline 310 at their respective wordline nodes 12, as shown. Likewise, all memory cells 330 in a plane perpendicular to the plane of the cross-section shown are tied to a single digitline 320 at their respective digitline nodes 10. This construction gives rise to the plurality of overlapping wordlines and digitlines depicted in FIG. 2. Strapping layer 16 is a metal layer disposed along the surface of a digitline 320 in order to enhance conductivity. Strapping layer 16 is preferably a tungsten layer disposed above digitline 320 over its entire length (i.e., in the direction extending into the page on FIG. 3). Strapping layer 16 is optional. Digitline 320 is preferably wider that strapping layer 16 (along the cross-section shown).

Disposed inside container 20 are first silicon layer 22 and second silicon layer 24, which comprise a diode. First and second silicon layers 22 and 24 may be single crystal or polycrystalline silicon layers, as described below. First and second silicon layers 22 and 24 will preferably be of opposite silicon types. For example, first layer 22 may be P-type and second layer 24 may be N-type. First silicon layer 22 will preferably be an epitaxial or single crystal layer of the same polarity as digitline 320. Second silicon layer 24 will preferably be polysilicon of the opposite polarity. In other embodiments, the diode may have more silicon layers. Lower spacers 26 are oxide or nitride spacers that electrically isolate the patterned edges of silicon layers 22 and 24 from wordline 310.

The remainder of the structure, disposed between the top of second silicon layer 24 and wordline 310, comprises the memory element portion of memory cell 330. Layer 28 may be disposed above second silicon layer 24. Layer 28 is preferably composed of tungsten or another highly conductive material such as titanium silicide, tungsten silicide or titanium nitride. Chalcogenide layer 30 is sandwiched between lower electrode 32 and upper electrode 34.

Many chalcogenide alloys may be suitable for use as a memory element in connection with the present invention. Preferably, the chalcogenide composition will be formed from tellurium, selenium, germanium, antimony, bismuth, lead strontium, arsenic, sulfur, silicon, phosphorus, oxygen, and mixtures or alloys of these elements. These alloys will be selected so as to create a material capable of assuming multiple, generally stable, states in response to the stimulus applied. Alloys of tellurium, germanium, and antimony may be desirable, and materials having approximately 50% tellurium, approximately 20% germanium, and approximately 20% antimony, in combination with other elements such as sulfur or arsenic, may be particularly desirable. One exemplary mixture will have tellurium, germanium and antimony combined in approximate proportions of 55:22:22, respectively.

Upper and lower electrodes serve as electrical contacts for chalcogenide layer 30. Upper and lower electrodes 32 and 34 preferably comprise a metal layer and a carbon layer, with the carbon layer disposed between the metal and the chalcogenide. Upper and lower electrodes 32 and 34 may be formed of other materials, but will preferably include a layer of material selected to serve as a diffusion barrier preventing undesirable contamination of chalcogenide layer 30. This diffusion barrier may be omitted entirely, for example, where the layers otherwise contacting chalcogenide layer 30 present no threat of contamination and do not adversely effect series resistance within the cell. Shaping layer 36 is preferably a nitride layer that serves to contour chalcogenide layer 30 so as to create a chalcogenide active area 36a in the center of memory cell 330. Shaping layer 36 may be composed of various other materials, including for example, oxide. Cap layer 38 is preferably nitride and serves to cap off memory cell 330 at the top and to define a contact opening 38a directly above the chalcogenide active area. As will be recognized by those skilled in the art, cap layer 38 may be composed various other materials effective to insulate the memory element of memory cell 330, including for example, oxide or a nitride-oxide combination. Upper spacers 40 are oxide or nitride spacers that electrically isolate the edges of the chalcogenide memory cell 330 from wordline 310. It will be appreciated that upper and lower spacers 26 and 40 could be combined into a single spacer isolating the exposed edges of memory cell 330 from wordline 310.

Figure 4:
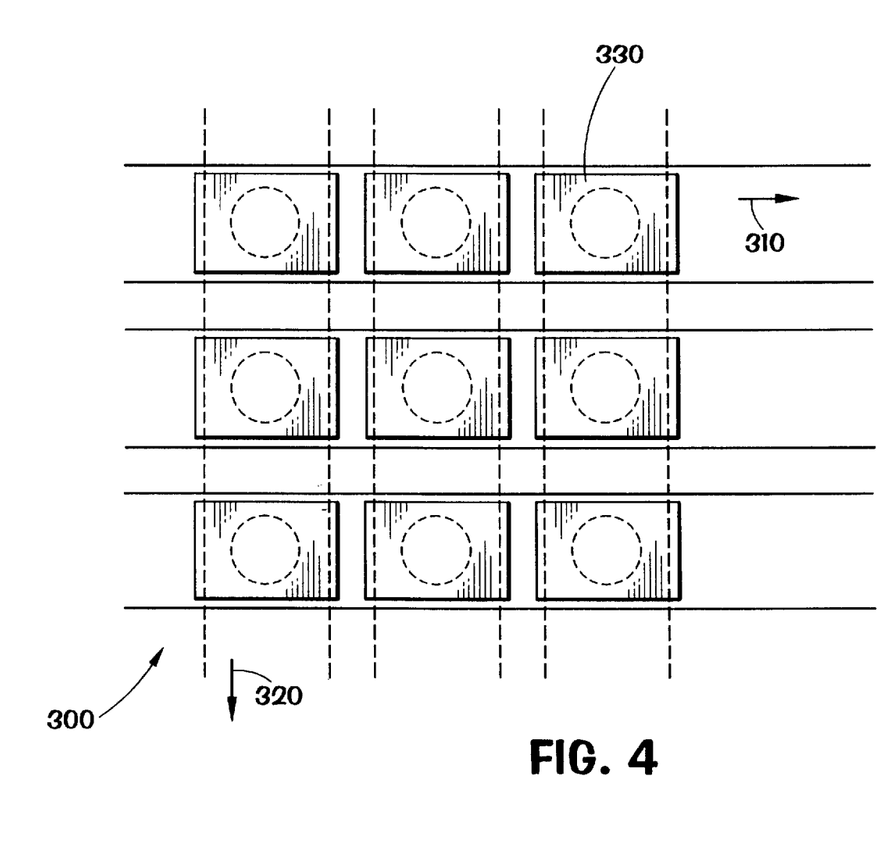
FIG. 4 is a view of an exemplary memory matrix showing the layout of a plurality of memory cells constructed in accordance with the present invention.

FIG. 4 is a view of a memory matrix 300 comprising a plurality of memory cells 330 constructed according to the present invention. This view will help one skilled in the art visualize and understand the physical layout of the unique structure disclosed herein. Each memory cell 330 is disposed at the intersection of a wordline 310 and a digitline 320. Digitline 320 is shown in outline form to indicate that it is disposed beneath the surface. Also shown in outline form is the contact pore formed by cap layer 38 at the center of each memory cell 330.

As described above, memory cell 330 may be capable of being operated in multiple modes including a program mode, a read mode, a deselect mode, and a program inhibit mode. The operation of memory cell 330 is preferably controlled by regulating the voltage differential between digitline 320 and wordline 310. In this way, current flow across chalcogenide layer 30 is regulated. For example, in a program mode, the current flow resulting from a voltage differential of three volts from digitline 320 to wordline 310 may cause chalcogenide layer 30 to assume a high resistivity level of approximately 100 kohms, whereas the current flow due to a voltage difference of two volts may cause a low resistivity level of approximately 1 kohm to be stored in said chalcogenide layer 30. A voltage differential of about one volt or less may be used to read or sense the cell 300 (i.e., the resistivity) without changing its state. Moreover, other voltages may be used to store data in higher base systems (greater than binary) or to operate memory cell 330 in another mode. As will be recognized, these voltages and operational characteristics are purely exemplary, and are subject to many variations and modifications. The voltage differential applied to each cell 330 will preferably be controlled by periphery circuitry 400. The common n-well used in such an embodiment will preferably be tied to Vcc potential, as in standard CMOS circuit operation.

The special advantages of the embodiment shown in FIG. 3 in effecting the desired operability of memory cell 330 can now be understood. As is discussed above, it is significant to the operation of a chalcogenide-based memory cell that a large current flow be deliverable to the chalcogenide element. Memory cell 330 of the present invention is particularly effective in this regard, in part, because of its large diode surface area. Unlike the prior art, however, the present stack/trench diode achieves its high current throughput without also requiring a great deal of space on the upper surface of memory 100. With reference to FIG. 4, each memory cell 330 can preferably be constructed to be approximately 0.6 microns×0.6 microns or smaller, assuming a 0.25 micron photolithography resolution.

In addition, memory cell 330 includes other features designed to reduce series resistance in the memory cell, thereby increasing current flow. These features include a strapped digitline 320. Strapping layer 16 is a metal layer that is disposed in contact with a polysilicon digitline 320, for instance, in order to create a low-resistance current path along the interfacing surfaces of those layers. In addition to strapping layer 16, other preferred features reduce resistance. A thin lining 21, preferably composed of $TiSi_2$, may be used along the inner surface of container 20 in order to further reduce series resistance.

Figure 5:
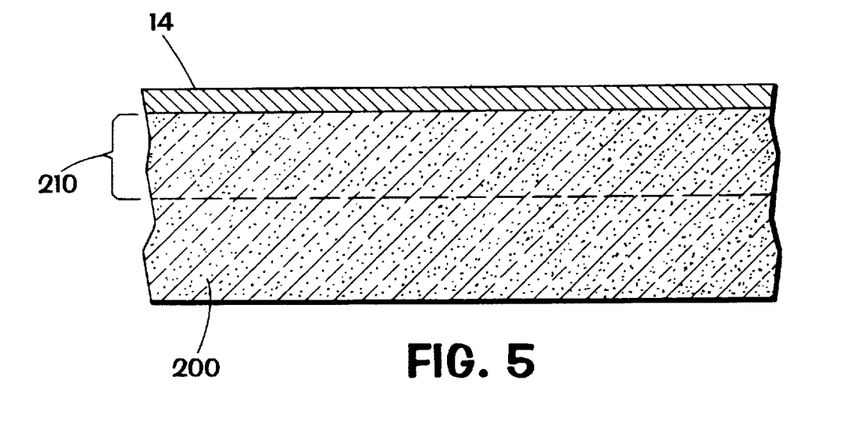
FIG. 5 is a cross-sectional view of an in-process memory cell according to the embodiment shown in FIG. 3, showing a silicon base in which a memory cell will be disposed.

The formation of the memory cell 330 shown in FIG. 3 is now described in detail. With reference first to FIG. 5, substrate 200 is a single crystal silicon substrate of p-type material. N-well 210 is formed in the top of substrate 200 using conventional n-well techniques well known in semiconductor processing. N-well 210 is preferably 3.5–4.0 microns deep. Patterning layer 14 is an oxide layer disposed on top of N-well 210 by oxidation or a TEOS deposition process. Patterning layer 14 is preferably 2000–3000 angstroms deep.

Figure 6:
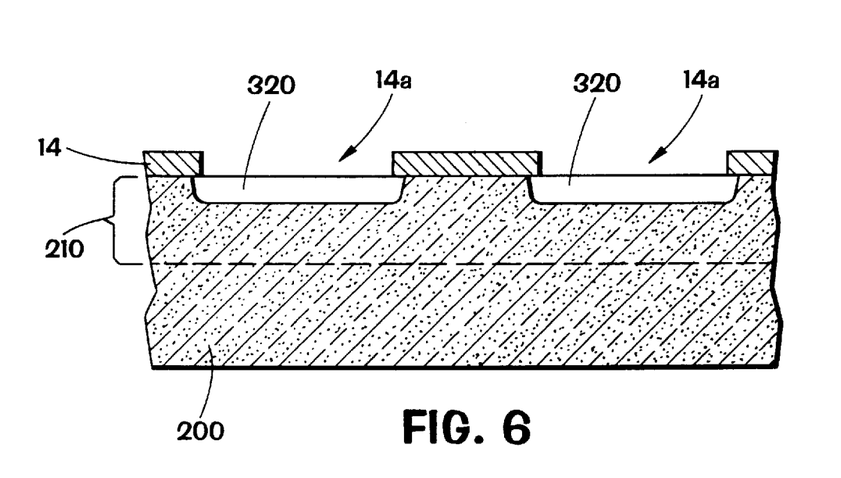
FIG. 6 is a cross-sectional view of an in-process memory cell according to the embodiment shown in FIG. 3, showing the formation of digitlines.

FIG. 6 shows how patterning layer 14 is selectively removed (by standard techniques including deposition of a photoresist and selective etching) to form the pattern for digitlines 320. Digitlines 320 are long strips of P+-type silicon extending into the paper in a direction perpendicular to the cross-section shown. Digitlines 320 may be formed by standard techniques, such as diffusion or ion implantation. Digitline 320 is preferably about 0.1–0.2 microns deep and is doped to about $10^{19}$–$10^{21}$ atoms/cc. The depth of digitline 320 may be optimized based on the location of the diode junction, described below. The width of digitline 320 (in the cross-section shown) is preferably greater than the width of the gap in patterning layer 14. This prevents the diode formed in container 20 from being shorted with n-well 210.

Figure 7:
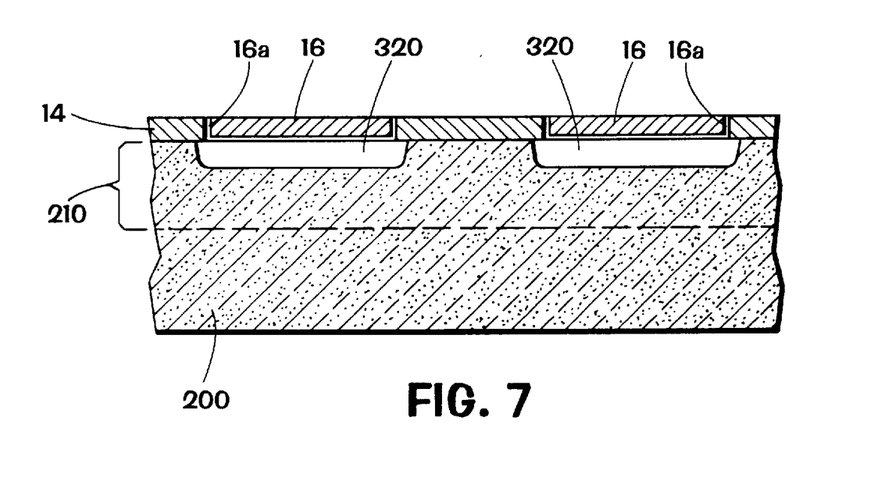
FIG. 7 is a cross-sectional view of an in-process memory cell according to the embodiment shown in FIG. 3, showing the formation of strapping layers above digitlines.

FIG. 7 illustrates how patterning layer 14 defines the pattern for strapping layer 16. After the formation of digitlines 320 in the manner described above, the channels 14a formed in patterning layer 14 may be filled with strapping layer 16. In this way, strapping layer 16 is deposited without the need for an additional mask step. Strapping layer 16 is a refractory metal intended to reduce resistance in digitline 320. It is preferably tungsten or tungsten silicide deposited in channels 14a, followed by a chemical-mechanical polish or etch-back process. A titanium nitride liner 16a may be deposited before strapping layer 16. In another embodiment, strapping layer 16 is composed of $TiSi_2$, which performs the same role of reducing resistance.

Figure 8:
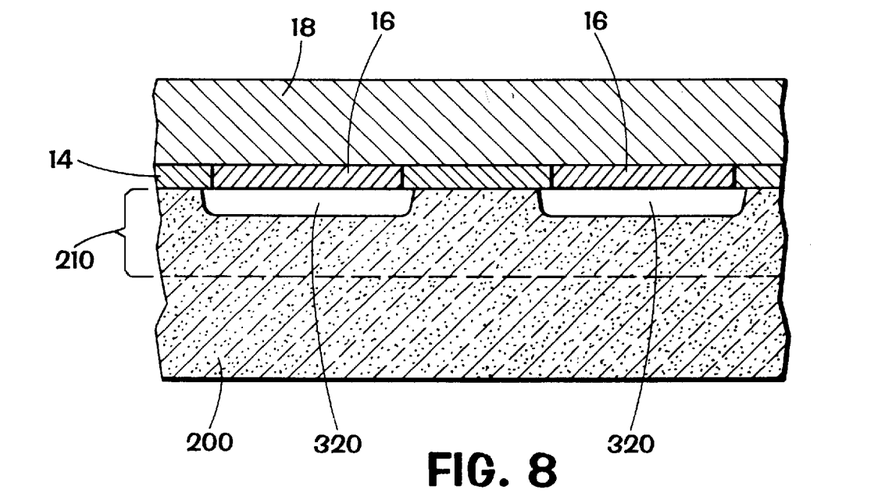
FIG. 8 is a cross-sectional view of an in-process memory cell according to the embodiment showing FIG. 3, showing the formation of a tall oxide layer.

FIG. 8 shows a tall oxide layer 18 that is formed on top of patterning layer 14 and strapping layer 16. Tall oxide layer 18 is preferably formed using a TEOS deposition process (without doping). The TEOS deposition process is preferred over other methods such as growing the oxide layer, because the TEOS process does not require an additional silicon layer to be oxidized. Tall oxide layer 18 is preferably 1 micron thick.

Figure 9:
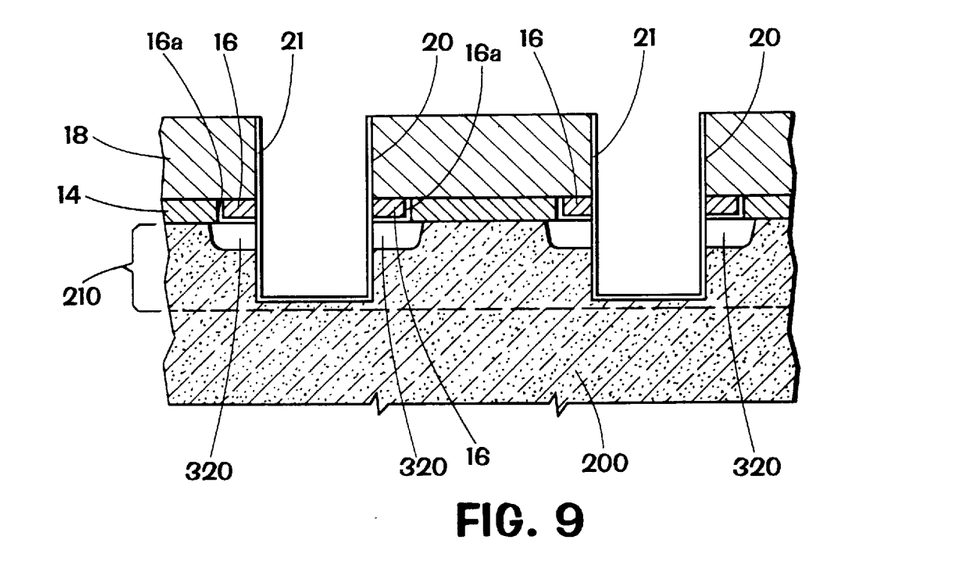
FIG. 9 is a cross-sectional view of an in-process memory cell according to the embodiment shown in FIG. 3, showing the formation of a diode container.

FIG. 9 illustrates how container 20 is formed by selectively etching away tall oxide layer 18, tungsten strapping layer 16, digitline 320 and silicon N-well 210. The tall oxide layer 18 can be etched using a $CF_4$ dry etch. The tungsten and/or other layers can also be etched using a dry etch such as HBr or $SF_6$. Container 20 is preferably about 2 microns deep, extending from the top of tall oxide layer 18 to the bottom of the trench in N-well 210. After formation of container 20, a thin lining 21 of $TiSi_2$ may be deposited to reduce resistance of the cell.

Figure 10:
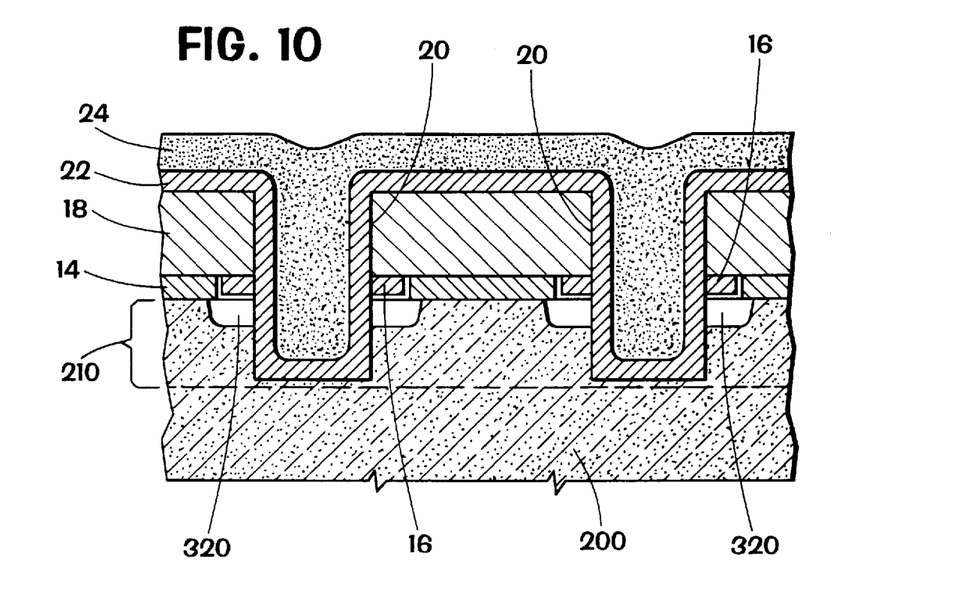
FIG. 10 is a cross-sectional view of an in process memory cell according to the embodiment shown in FIG. 3, showing the formation of silicon layers comprising a diode.

FIG. 10 shows how the vertical diode is formed in container 20. First and second silicon layers 22 and 24 are deposited concentrically inside container 20. First silicon layer 22 is a P-silicon layer that is formed of polycrystalline silicon, amorphous silicon, or epitaxial silicon. For first silicon layer 22, epitaxial silicon is preferred. Second silicon layer 24 is formed above first silicon layer 22. Second silicon layer is a N+ silicon layer that may be formed of polycrystalline silicon, amorphous silicon, or epitaxial silicon. For second silicon layer 24, polycrystalline silicon is preferred. Second silicon layer 24 is preferably insitu doped. A step to out-diffuse the dopant from second silicon layer 24 into first silicon layer 22 is preferably performed. This may be done by a rapid thermal processing (RTP) step at 1000°

C. for 10 seconds. In this way, the diode junction can be moved away from the P/N interface.

Figure 11:
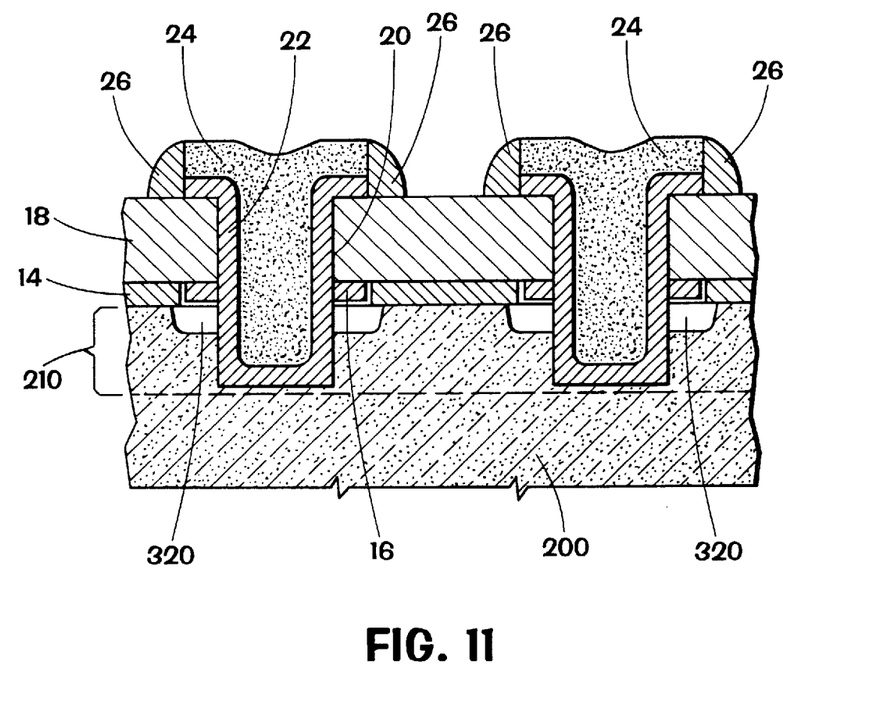
FIG. 11 is a cross-sectional view of an in-process memory cell according to the embodiment shown in FIG. 3, showing the formation of oxide spacers.

FIG. 11 illustrates the completed vertical diode formed in and above container 20. After deposition of second silicon layer 24, an oversized photoresist is deposited on top of the diode structure, and a poly etch is performed to remove the excess portions of first and second silicon layer 22 and 24. Finally, lower spacers 26 are formed by depositing an oxide film and selectively etching that film in a conventional manner so as to leave only lower spacers 26. This completes processing of the vertical diode.

After formation of the vertical diode, the rest of memory cell 330 may be formed as follows. With reference to FIG. 3, layer 28 is formed by depositing a tungsten layer. Lower electrode 32 is preferably a dual metal-carbon layer deposited on top of layer 28. Shaping layer 36 is preferably formed by depositing a nitride layer, selectively etching the nitride layer so as to define the pore at the center of memory cell 330, and then stripping any remaining resist. Chalcogenide layer 30 is deposited, in the conventional manner, so that the chalcogenide comes into contact with lower electrode 32 in the pore defined by shaping layer 36. This defines the chalcogenide active area 36a, which is preferably about 0.3 microns across. An upper electrode 34 is formed by a carbon deposit on top of chalcogenide layer 30. An additional metal layer may be added to form the upper electrode 34. Cap layer 38 is preferably formed by depositing a nitride layer on top of upper electrode 34 and selectively etching the nitride layer to define a contact opening 38a directly above the chalcogenide active area, so as to place upper electrode 34 in electrical communication with wordline 310. Wordline 310 is formed by the deposition and selective etching of a metal layer. As is shown in FIG. 4, wordline 310 establishes electrical communication among all memory cells 330 disposed in the same horizontal row.

We claim:

1. A chalcogenide-based memory cell having a first node and a second node, said cell comprising:
   a silicon base;
   an oxide layer disposed above said silicon base;
   a diode container extending from a top surface of said oxide layer downwardly into a trench formed in said silicon base, said first node being disposed in electrical communication with a perimeter of said container;
   a diode disposed inside said container; and
   a chalcogenide memory element electrically coupled between said diode and said second node of said memory cell.

2. The memory cell of claim 1, wherein said first node is disposed in said silicon base along said perimeter of said diode container.

3. The memory cell of claim 1, wherein a container lining is disposed along said perimeter of said container between said perimeter and said diode, said lining effective to reduce the resistance presented by said diode during operation of said cell.

4. The memory cell of claim 1, wherein said diode comprises a first silicon layer disposed around said perimeter of said container, and a second silicon layer disposed concentrically inside said first silicon layer.

5. The memory cell of claim 4, wherein said first silicon layer is an epitaxial silicon layer and wherein said second silicon layer is a polysilicon layer.

6. The memory cell of claim 1, wherein said memory cell further comprises a spacer disposed at an edge of said diode, said edge being formed where said diode emerges from said container, said spacer effective to electrically isolate said diode from surrounding regions.

7. The memory cell of claim 1, wherein said memory element comprises a chalcogenide layer and a shaping layer, said shaping layer contouring said chalcogenide layer to at least partially define a chalcogenide active area at a center of said memory cell where said chalcogenide layer is in electrical communication with said diode.

8. A chalcogenide-based memory matrix formed on a structure having an oxide layer disposed above a silicon base, said matrix comprising:
   a plurality of memory cells disposed between a plurality of first address lines and second address lines, each said memory cell comprising:
      (i) a first node and a second node, said first node being electrically connected to one of said first address lines and said second node being electrically connected to one of said second address lines;
      (ii) a chalcogenide memory element electrically coupled to said second node; and
      (iii) a diode disposed in a container extending from a top surface of said oxide layer downwardly into a trench formed in said silicon base, said diode being electrically coupled between said memory element and said first node.

9. The memory of claim 8, wherein said first node of each said memory cell is in communication with said container so as to create an electrical contact between said first node and said diode.

10. The memory of claim 9, wherein said diode of each said memory cell comprises a first silicon layer disposed about a wall of said container, and a second silicon layer disposed concentrically inside said first silicon layer.

11. The memory of claim 10, wherein said first silicon layer is a layer of P− epitaxial silicon, and wherein said second silicon layer is a layer of N+ polycrystalline silicon.

12. The memory cell of claim 9, wherein said first address line is a digitline and said second address line is a wordline.

13. The memory of claim 9, wherein said first node of each said memory cell is disposed along an upper surface of said silicon base, and wherein each said first node is a part of one of said first address lines.

14. The memory cell of claim 13, wherein a strapping layer is disposed in electrical contact with each of said first address lines across its entire length.

15. The memory of claim 14, wherein said strapping layer is a tungsten layer.

16. The memory of claim 8, wherein said silicon base is an n-well formed in a p-type substrate.

* * * * *